United States Patent
Nagai et al.

(10) Patent No.: US 6,305,970 B1
(45) Date of Patent: Oct. 23, 2001

(54) TERMINAL END STRUCTURE OF FLAT CIRCUITRY AND BRANCH CONNECTION STRUCTURE CONSTITUTED BY THE SAME

(75) Inventors: Kentaro Nagai; Yasumichi Kuwayama; Shinji Mochizuki; Akira Sugiyama, all of Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/717,400

(22) Filed: Nov. 22, 2000

(30) Foreign Application Priority Data

Nov. 29, 1999 (JP) .................................................. 11-338462
Dec. 28, 1999 (JP) .................................................. 11-375845

(51) Int. Cl.[7] .................................................. H01R 12/24
(52) U.S. Cl. .......................... 439/492; 439/422; 439/495
(58) Field of Search .................... 439/492, 422, 439/421, 877, 423, 424, 494, 495, 496, 499

(56) References Cited

U.S. PATENT DOCUMENTS 3,088,086 * 4/1963 Crimmins ............................. 439/492
6,152,763 * 11/2000 Sai ....................................... 439/492

FOREIGN PATENT DOCUMENTS

| 64-7712 | 1/1989 | (JP) . |
| 5-53042 | 7/1993 | (JP) . |
| 06-208873 | 7/1994 | (JP) . |
| 2549583 | 6/1997 | (JP) . |

* cited by examiner

*Primary Examiner*—Tho D. Ta
(74) *Attorney, Agent, or Firm*—Morgan, Lewis & Bockius LLP (57) ABSTRACT

A plurality of terminals 22 are fixedly press-connected to an end portion of the flat circuitry 21 in electrically connected relation respectively to conductors 21a, and the terminals 22 are inserted respectively into terminal receiving chambers 24 in a connector housing 23. Slits 26 are formed through the end portion of the flat circuitry 21 in such a manner that the slit is arranged between any two adjacent conductors 21a, and extends from the distal end of the flat circuitry to a position beyond press-connecting portions 25 of the terminals. The terminals 22, fixedly secured to the end portion of the flat circuitry 21, are inserted respectively into the terminal receiving chambers 24 in the connector housing 23 in such a manner that the press-connecting portion 25 of each terminal is received in the associated terminal receiving chamber 24 in the connector housing 23 and that partition walls 24a of the terminal receiving chambers 24 are inserted respectively into the slits 26 to a position beyond the press-connecting portions 25 of the terminals.

6 Claims, 6 Drawing Sheets

TERMINAL END STRUCTURE OF FLAT CIRCUITRY AND BRANCH CONNECTION STRUCTURE CONSTITUTED BY THE SAME

BACKGROUND OF THE INVENTION

This invention relates to a terminal end structure of a flat circuitry, such as a flexible flat cable (FFC) and a flexible printed circuit (FPC), and also to a branch connection structure of the flat circuitry.

Generally, when electrically connecting circuitries together, using a flat circuitry, a connector is connected to an end portion of this flat circuitry, and this connector is connected to a mating connector.

Figure 8:
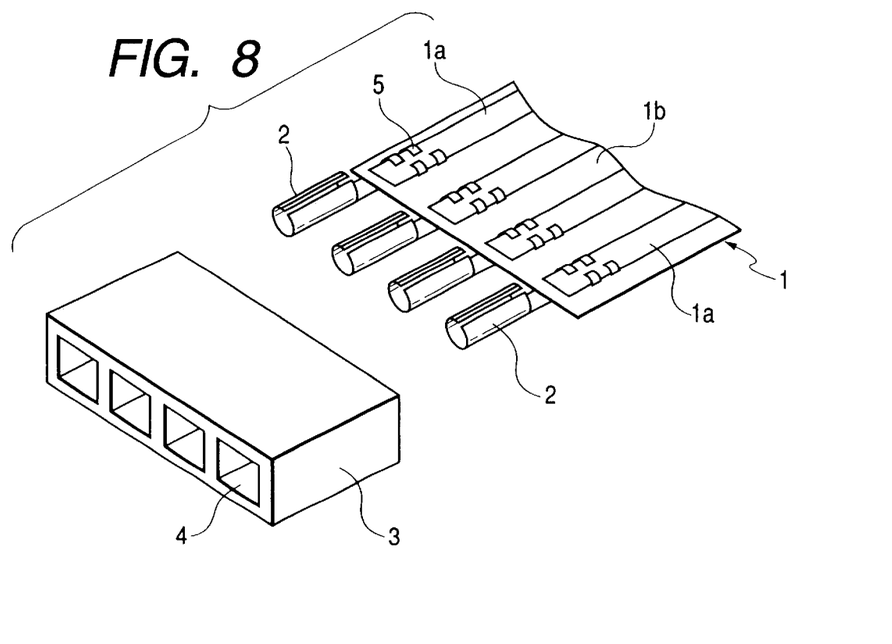
FIG. 8 is a perspective view of a first related flat circuitry.

FIG. 8 shows a related terminal end structure of a flat circuitry for effecting such connection. The flat circuitry 1 comprises a plurality of conductors 1a fixedly held between insulating films 1b. First, terminals 2 are fixedly press-connected to an end portion of the flat circuitry 1 in electrically connected relation to the respective conductors 1a. Then, the terminals 2 are inserted respectively into terminal receiving chambers 4 in a connector housing 3. Thus, the terminal end structure of the flat circuitry 1 is formed. In this case, press-connecting portions 5 of the terminals 2 are disposed outside of the connector housing 3.

Figure 9:
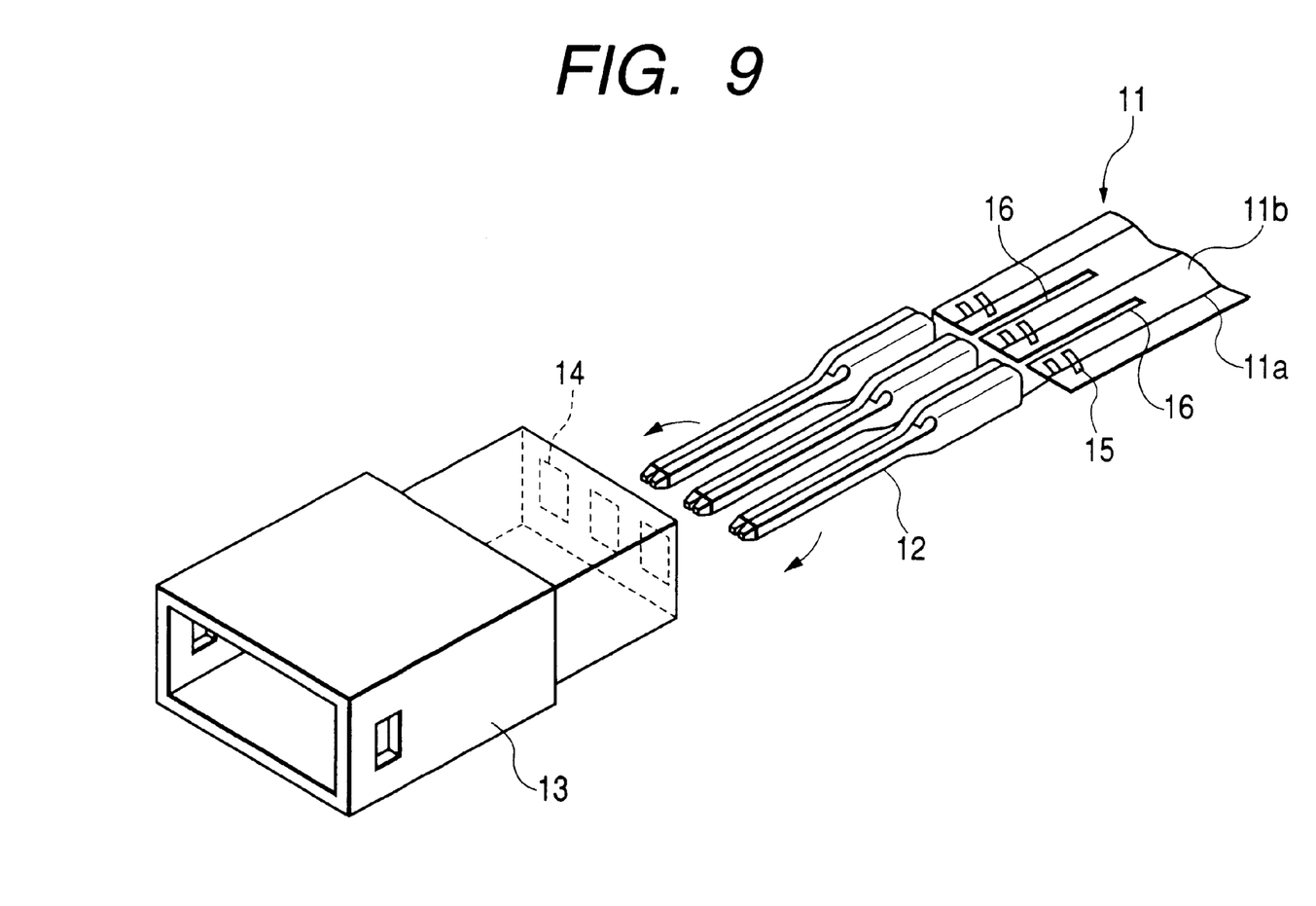
FIG. 9 is a perspective view of a second related flat circuitry.

FIG. 9 shows another related construction. In this example, also, terminals 12 are fixedly press-connected to an end portion of a flat circuitry 11 (having a plurality of conductors 11a held between insulating films 11b) in electrically-connected relation to the respective conductors 11a. Then, the terminals 12 are inserted respectively into terminal receiving chambers 14 in a connector housing 13, thus forming a terminal end structure. Slits 16 are beforehand formed in the end portion of the flat circuitry 11 so that the interval between the adjacent conductors 11a can be adjusted. With this construction, the interval between the adjacent terminals 12, connected respectively to the conductors 11a, can be adjusted in accordance with the intervals and arrangement of the terminal receiving chambers 14 in the connector housing 13. In this case, also, press-connecting portions 15 are disposed outside of the connector housing 13.

In the above related terminal end structures of the flat circuitry, the press-connecting portions 5, 15 of the terminals 2, 12, connected respectively to the conductors 1a, 11a, are disposed outside of the connector housing 3, 13, and are not covered with any member. Therefore, there has been a possibility that the conductors 1a, 11a are short-circuited together by dew condensation.

SUMMARY OF THE INVENTION

With the above problem in view, it is an object of this invention to provide a terminal end structure of a flat circuitry, as well as a branch connection structure of a flat circuitry, in which the short-circuiting between conductors by dew condensation is eliminated.

In order to achieve the above object, according to the present invention, there is provided a terminal end structure of an electric connection, comprising:

a flat circuitry in which a plurality of conductors are arranged and fixedly held between an insulating film so as to be isolated from each other;

a plurality of terminals respectively secured to a first predetermined portion of each of the conductors to electrically connect therewith; and a connector housing provided with a plurality of chambers defined by a partition wall for respectively receiving the terminals, wherein the insulating film is formed with a slit arranged between adjacent conductors, which extends from an end portion of the flat circuitry so as to have a predetermined length which is longer than a length between the end portion of the flat circuitry and the first predetermined portion; and wherein the partition wall of the connector housing is inserted into the slit such that the first predetermined portions of the conductors are accommodated in the respective chambers when the terminals are inserted in the associated chambers.

In this structure, the secured portions of the terminals are received within the connector housing, and the adjacent secured portions are isolated from each other by the partition wall of the terminal receiving chambers, and therefore even when dew condensation is occurred, the secured portions (and hence the conductors) will not be short-circuited together.

Preferably, the insulating film is formed with a slot arranged between adjacent conductors and extending in a longitudinal direction of the flat circuitry. Here, the end portion of the flat circuitry and the slit is formed by folding a second predetermined portion which is a longitudinal center portion of the slot.

In this structure, the terminals are fixedly secured to the double-folded end portion of the flat circuitry, and therefore the securing strength can be increased.

Preferably, the folded portion of the flat circuitry is used as a branch connection terminal of the electric connection.

In this structure, any special branch connection device is not needed, and the branch connection can be easily effected, merely using the ordinary terminals and the connector housing.

According to the present invention, there is also provided a terminal end structure of an electric connection, comprising:

a flat circuitry in which a plurality of conductors are arranged and fixedly held between an insulating film so as to be isolated from each other;

a connector housing provided with a plurality of chambers defined by a partition wall; and a plurality of press-connecting terminals respectively provided in each of the chambers, which are to be secured to a first predetermined portion of each of the conductors to electrically connect therewith, wherein the insulating film is formed with a slit arranged between adjacent conductors, which extends from an end portion of the flat circuitry so as to have a predetermined length which is longer than a length between the end portion of the flat circuitry and the first predetermined portion; and wherein the partition wall of the connector housing is inserted into the slit such that the first predetermined portions of the conductors are accommodated in the respective chambers when the conductors are press-connected with the associated press-connecting terminals.

In this structure, when the end portion of the flat circuitry is press-connected to the press-contacting terminals received in the connector housing, the partition wall of the terminal receiving chambers are inserted in the slit. Therefore, the adjacent press-contacting terminals, including those portions press-contacted with the conductors of the flat circuitry, are isolated from each other by the partition wall of the terminal receiving chambers, and therefore the short-circuiting due to dew condensation is eliminated.

Preferably, the insulating film is formed with a slot arranged between adjacent conductors and extending in a longitudinal direction of the flat circuitry. Here, the end portion of the flat circuitry and the slit is formed by folding a second predetermined portion which is a longitudinal center portion of the slot.

In this structure, the terminals are fixedly secured to the double-folded end portion of the flat circuitry, and therefore the press-connecting strength can be increased.

Preferably, the folded portion of the flat circuitry is used as a branch connection terminal of the electric connection.

In this structure, any special branch connection device is not needed, and the branch connection can be easily effected, merely using the ordinary terminals and the connector housing.

DETAILED DESCRIPTION OF THE PREFERRED EMBODIMENTS

A preferred embodiment of the present invention will now be described with reference to the drawings.

Figure 1A:
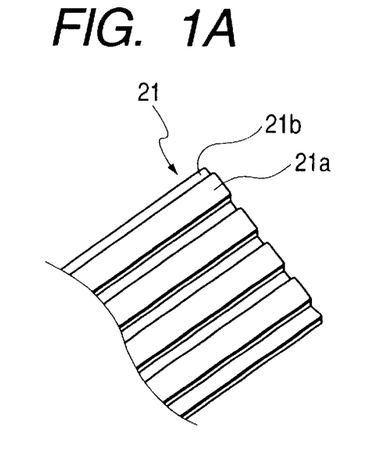
FIGS. 1A to 1C are views explanatory of a flat circuitry according to a first embodiment of the invention, FIG. 1A being a perspective view showing an end portion of the flat circuitry, FIG. 1B being a perspective view showing a condition in which slits are formed in the end portion of the flat circuitry, and FIG. 1C being a perspective view showing a condition in which terminals, secured to the end portion of the flat circuitry are to be inserted into a connector housing.
Figure 1B:
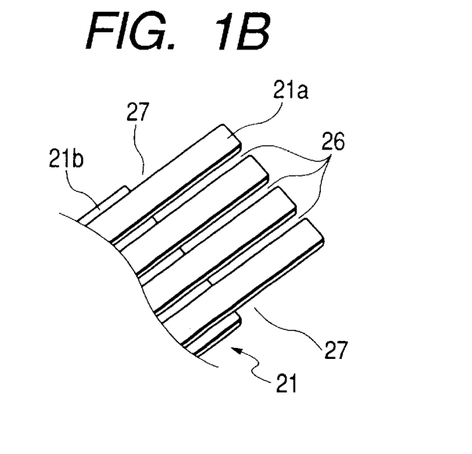
Figure 1C:
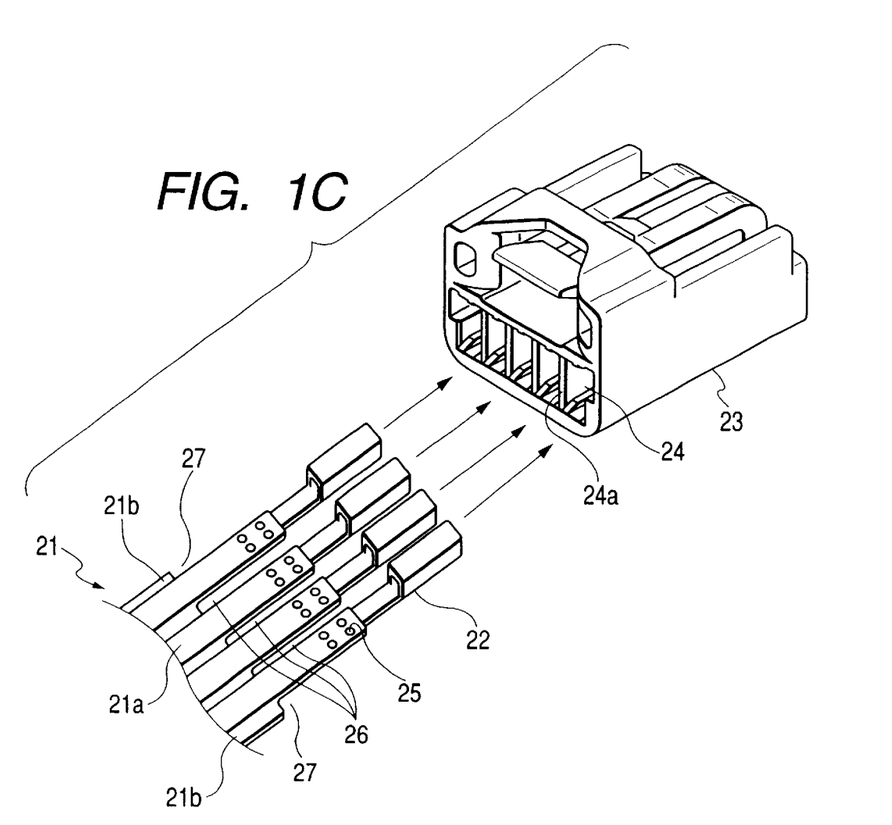

FIGS. 1A to 1C are views explanatory of a terminal end structure of a flat circuitry according to a first embodiment. As shown in FIG. 1A, the flat circuitry 21 has a plurality of parallel conductors 21a fixedly held between insulating films 21b. In this figure, those portions of the flat circuitry, at which the conductors are disposed, respectively, are designated by reference numeral 21a.

For forming the terminal end structure of this embodiment, first, slits 26 are formed through an end portion of the flat circuitry 21 in such a manner that the slit 26 is disposed between any two adjacent conductors 21a as shown in FIG. 1B, the slits 26 extending from the distal end of the flat circuitry 21. If both side edge portions of the insulating films 21b interfere with the connector housing 23 during the insertion of the flat circuitry into the connector housing 23, notches 27 are formed respectively in these both side edge portions of the insulating films 21.

Then, terminals 22 are fixedly press-connected to the end portion of the flat circuitry 21, as shown in FIG. 1C. More specifically, a plurality of claws (not shown) are formed on and project from a rear end portion of the terminal 22, and these claws are pierced through the insulating films 21b and the conductor 21a of the flat circuitry 21, thereby fixedly press-connecting the terminal 22 to the end portion of the flat circuitry 21. In this case, the slits 26 extend beyond press-connecting portions 25 of the terminals 22.

Figure 2:
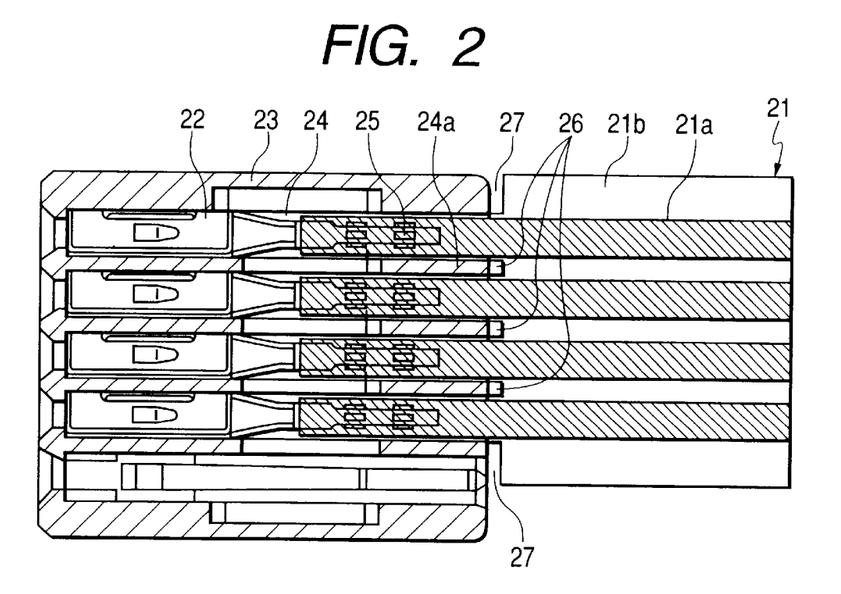
FIG. 2 is a cross-sectional view of a connecting structure according to the first embodiment.

Then, the terminals 22 are inserted respectively into terminal receiving chambers 24 in the connector housing 23. As a result, the press-connecting portion 25 of each terminal 22 is received in the terminal receiving chamber 24 in the connector housing 23, and partition walls 24a of the terminal receiving chambers 24 are inserted respectively into the slits 26 to a position beyond the press-connecting portions 25 of the terminals 22, as shown in FIG. 2.

Therefore, the adjacent press-connecting portions 25 are isolated from each other by the partition walls 24a of the terminal receiving chambers 24 inserted in the slit 26. Therefore, even when dew condensation is occurred, the press-connecting portions 25 (and hence the conductors 21a) will not be short-circuited together.

Next, description will be made of a second embodiment in which an end portion of a flat circuitry is folded on itself, and terminals are press-connected to this folded portion.

Figure 3:
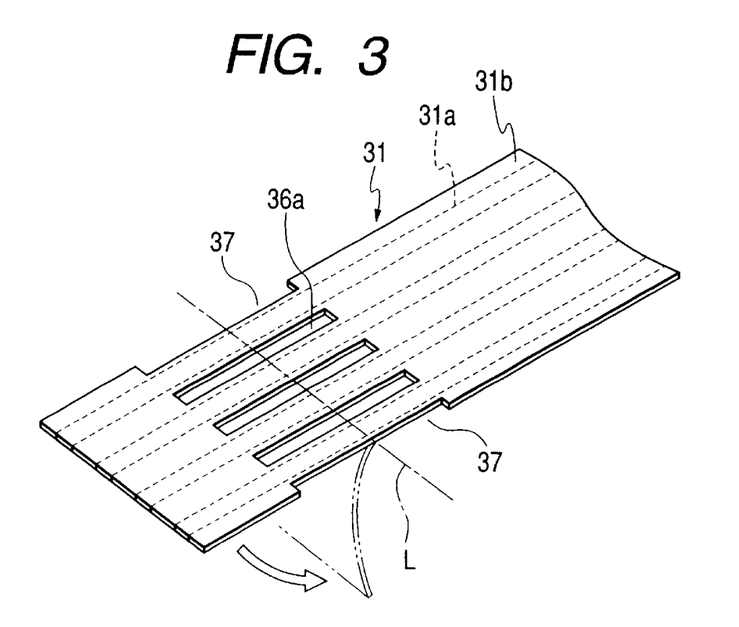
FIG. 3 is a perspective view explanatory of a flat circuitry according to a second embodiment of the invention, showing a condition in which slots are formed through an end portion of the flat circuitry.

As shown in FIG. 3, the flat circuitry 31 of this embodiment has a plurality of parallel conductors 31a fixedly held between insulating films 31b. For forming a terminal end structure of this embodiment, first, slots 36a are formed through the end portion of the flat circuitry 31. in such a manner that the slot 36a is disposed between any two adjacent conductors 31a in spaced relation to the distal end of the flat circuitry 31. If both side edge portions of the insulating films 31b interfere with a connector housing during the insertion of the flat circuitry into the connector housing, notches 37 are formed respectively in these both side edge portions of the insulating films 31.

Figure 4:
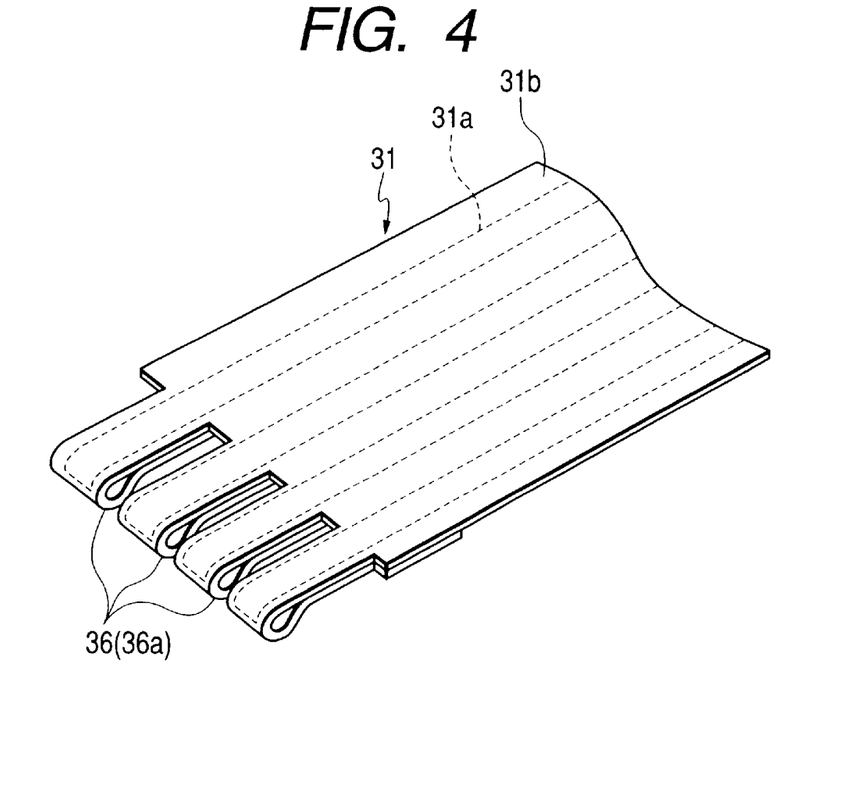
FIG. 4 is a perspective view showing a condition in which the flat circuitry is folded on itself, thereby forming slits by the slots.

Then, the end portion of the flat circuitry 31 is folded on itself at a region (designated by reference character L in FIG. 3) situated in an almost longitudinal center portion of the slots 36a, so that slits 36, extending from the distal end of the flat circuitry 31, are formed by the slots 36a, respectively, as shown in FIG. 4.

Figure 5:
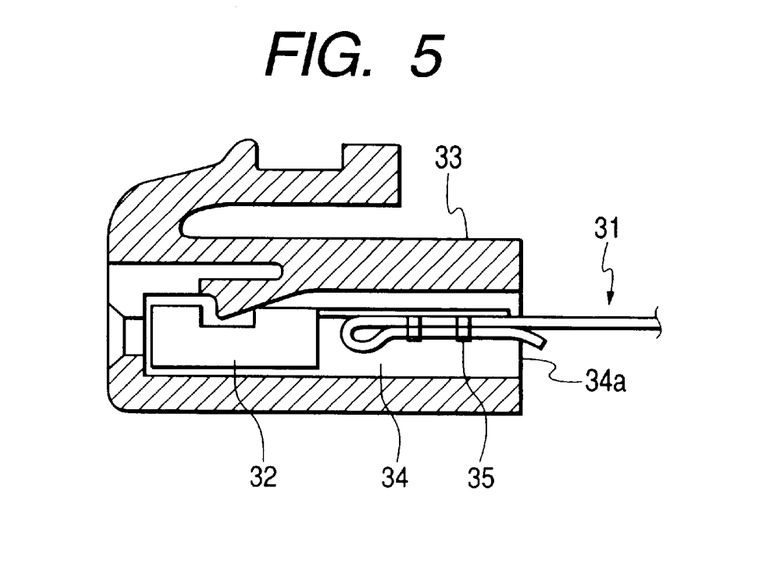
FIG. 5 is a cross-sectional view of a connecting structure according to the second embodiment.

Then, the terminals 32 are fixedly press-connected to the double-folded end portion of the flat circuitry 31, and press-connecting portions 35 of the terminals 32 are inserted respectively into terminal receiving chambers 34 in the connector housing 33, and at the same time partition walls 34a of the terminal receiving chambers 34 are inserted respectively into the slits 36 to a position beyond the press-connecting portions 35 of the terminals 32, as shown in FIG. 5.

As a result, the adjacent press-connecting portions 35 are isolated from each other by the partition walls 34a of the terminal receiving chambers 34 inserted in the slit 36. Therefore, even when dew condensation is occurred, the press-connecting portions 35 (and hence the conductors 31a) will not be short-circuited together. And besides, in this structure, the terminals 32 are press-connected to the double-folded end portion of the flat circuitry 31, and therefore the firm press-connecting structure can be obtained.

Figure 6:
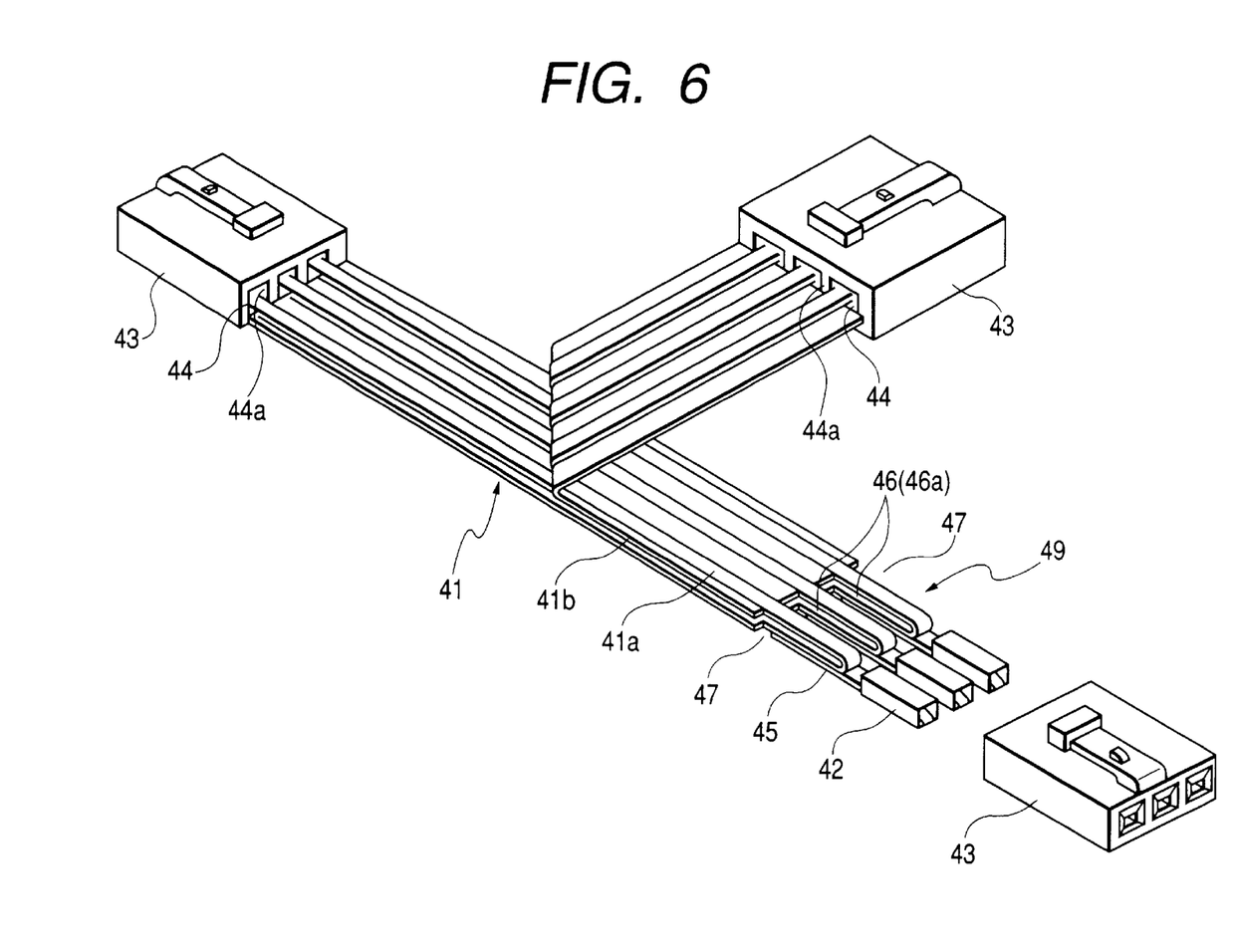
FIG. 6 is a perspective view of a branch connection structure according to a third embodiment of the invention.

FIG. 6 shows a branch connection structure of a flat circuitry which is a third embodiment of the present invention. The flat circuitry 41 has a plurality of parallel conductors 41a fixedly held between insulating films 41b. In this figure, those portions of the flat circuitry, at which the conductors are disposed, respectively, are designated by reference numeral 41a.

For forming the branch connection structure of this embodiment, first, the flat circuitry 41 is folded on itself at its central portion in its longitudinal direction in such a manner that each conductor 41a is arranged in two parallel, superposed layers, thereby forming a folded end portion 49 for branch connection purposes.

Then, slits 46 are formed through the folded end portion 49 in such a manner that the slit 46 is formed between any two adjacent conductors 41a, the slits 46 extending from the distal end of the folded end portion 49. If both side edge portions of the insulating films 41 interfere with a connector housing 43 during the insertion of the flat circuitry into the connector housing 43, notches 47 are formed respectively in these both side edge portions of the insulating films 41.

Then, terminals 42 are fixedly press-connected to the folded end portion 49 of the flat circuitry 41 as described above for the first and second embodiments. In this case, the slits 46 extend beyond press-connecting portions 45 of the terminal 42.

Slits are also formed in each of the opposite end portions of the flat circuitry 41 as described above for the first embodiment, and the same terminals 42 as those, fixedly secured to the folded end portion 49, are fixedly press-connected to the both end portions of the flat circuitry.

Then, the terminals 42, fixedly secured to the folded end portion 49 of the flat circuitry 41, are inserted respectively into terminal receiving chambers 44 in the connector housing 43. Similarly, the terminals 42, fixedly secured to each of the opposite end portions of the flat circuitry 42, are inserted respectively into terminal receiving chambers 44 of an associated connector housing 43. As a result, the press-connecting portion 45 of each terminal 42 is received in the terminal receiving chamber 44 in the connector housing 23, and partition walls 44a of the terminal receiving chambers 44 are inserted respectively into the slits 46 to a position beyond the press-connecting portions 45 of the terminals 42.

Therefore, the adjacent press-connecting portions 45 are isolated from each other by the partition wall 44a of the terminal receiving chambers 44 inserted in the slit 46. Therefore, even when dew condensation is occurred, the press-connecting portions 45 (and hence the conductors 41a) will not be short-circuited together.

In this structure, the terminals 42 are press-connected to the folded end portion 49 of the flat circuitry 41, and these terminals 42 are inserted into the connector housing 43, thereby providing the connector for branch connection purposes. Therefore, any special branch connection device is not needed, and the branch connection can be easily effected, merely using the terminals 42 of the ordinary type for a terminal portion and the connector housing 43.

As described above for the second embodiment of FIGS. 3 and 4, there may be used a method in which slots 46a are beforehand formed through the central portion of the flat circuitry 41 in its longitudinal direction in such a manner that the slot 46a is disposed between any two adjacent conductors 41a, and the flat circuitry 41 is folded on itself, thereby forming the slits 46 by the slots 46a. In this case, there is achieved an advantage that the slits 46 can be formed more easily as compared with the case where the flat circuitry 41 is first folded on itself, and then the slits are formed in the folded end portion 49.

Figure 7:
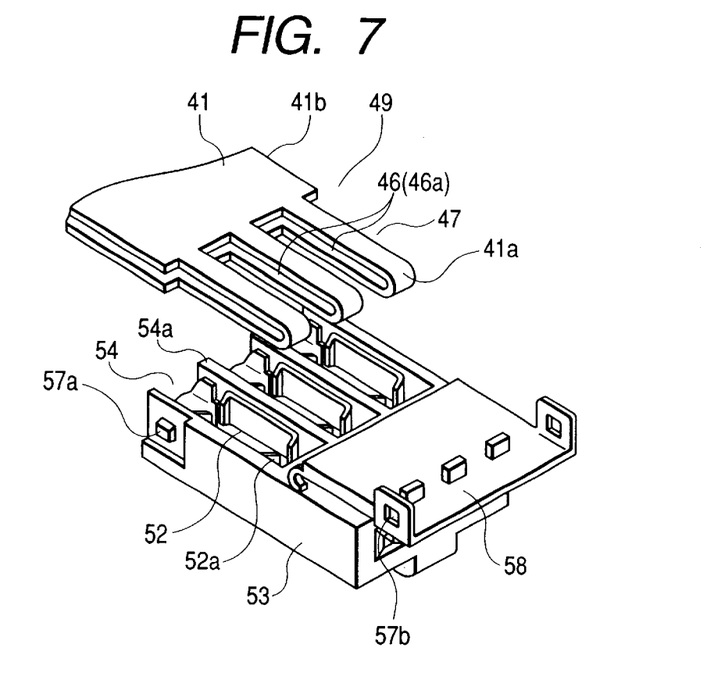
FIG. 7 is a perspective view of a branch connection structure according to a fourth embodiment of the invention.

FIG. 7 shows a branch connection structure of a flat circuitry which is a fourth embodiment of the invention. This embodiment is characterized in that a branch connection is effected, using press-contacting terminals instead of press-connecting terminals as used in the third embodiment.

A folded end portion 49 of the flat circuitry 41 has totally the same construction as that described for the third embodiment, and slits 46 are formed in the folded end portion 49.

On the other hand, a connector housing 53 has a plurality of terminal receiving chambers 54 separated from one another by partition walls 54a, and the press-contacting terminals 52 are received in the terminal receiving chambers 54, respectively. The press-contacting terminal 52 has press-contacting blades 52a which can bite into insulating films 41b of the flat circuitry 41 to come into electrical contact with a conductor 41a therein. An upper side of a rear half portion of each terminal receiving chamber 54 is open, and the folded end portion 49 of the flat circuitry 41 can be press-fitted into the terminal receiving chambers from the upper side.

For attaching the connector for branch connection purposes to the folded end portion 49 of the flat circuitry 41, the folded end portion 49 of the flat circuitry 41, having the slits 46, is inserted into the connector housing 53 from the upper side. At this time, the folded end portion 49 of the flat circuitry 41 is inserted into the connector housing 53 in such a manner that the partition walls 54a of the terminal receiving chambers 54 are fitted into the slits 46, respectively. The conductors 41a in the folded end portion 49 of the flat circuitry 41 are connected in a press-contacted manner respectively to the press-contacting terminals 52 received respectively in the terminal receiving chambers 54. Then, the opening, formed in the rear half portion of the upper wall of the connector housing 53, is closed by a cover 58, and this cover 58 is locked to the connector housing 53 by lock mechanisms 57a and 57b, thus completing the connector.

In this structure, the conductors 41a in the folded end portion 49 of the flat circuitry 41 are connected in a press-contacted manner respectively to the press-contacting terminals 52 received respectively in the terminal receiving chambers 54 in the connector housing 53, thereby providing the connector for branch connection purposes. Therefore, any special branch connection device is not needed, and the branch connection can be easily effected, merely using the press-contacting terminals 52 of the ordinary type and the connector housing 53.

Thus, the conductors are connected in a press-contacted manner to the press-contacting terminals 52 received respectively in the terminal receiving chambers 54 in the connector housing 53. In this connection, the slits 46 are formed in the folded end portion 49 of the flat circuitry 41, and the partition walls 54a of the terminal receiving chambers 54 are fitted in the slits 46, respectively. Therefore, the adjacent press-contacting terminals 52, including those portions press-contacted with the conductors 41a of the flat circuitry 41, are isolated from each other by the partition wall 54a of the terminal receiving chambers 54, and therefore even when dew condensation is occurred, the conductors will not be short-circuited together.

The press-ontacting connection method, used in this fourth embodiment, can be used also when attaching a connector to an end portion of the flat circuitry as in the first and second embodiment.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. A terminal end structure of an electric connection, comprising:
   a flat circuitry in which a plurality of conductors are arranged and fixedly held between an insulating film so as to be isolated from each other;
   a plurality of terminals respectively secured to a first predetermined portion of each of the conductors to electrically connect therewith; and
   a connector housing provided with a plurality of chambers defined by a partition wall for respectively receiving the terminals,
   wherein the insulating film is formed with a slit arranged between adjacent conductors, which extends from an end portion of the flat circuitry so as to have a predetermined length which is longer than a length between the end portion of the flat circuitry and the first predetermined portion; and
   wherein the partition wall of the connector housing is inserted into the slit such that the first predetermined portions of the conductors are accommodated in the respective chambers when the terminals are inserted in the associated chambers.

2. The terminal end structure as set forth in claim 1, wherein the insulating film is formed with a slot arranged between adjacent conductors and extending in a longitudinal direction of the flat circuitry; and
   wherein the end portion of the flat circuitry and the slit is formed by folding a second predetermined portion which is a longitudinal center portion of the slot.

3. The terminal end structure as set forth in claim 2, wherein the folded portion of the flat circuitry is used as a branch connection terminal of the electric connection.

4. A terminal end structure of an electric connection, comprising:
   a flat circuitry in which a plurality of conductors are arranged and fixedly held between an insulating film so as to be isolated from each other;
   a connector housing provided with a plurality of chambers defined by a partition wall; and
   a plurality of press-connecting terminals respectively provided in each of the chambers, which are to be secured to a first predetermined portion of each of the conductors to electrically connect therewith,
   wherein the insulating film is formed with a slit arranged between adjacent conductors, which extends from an end portion of the flat circuitry so as to have a predetermined length which is longer than a length between the end portion of the flat circuitry and the first predetermined portion; and
   wherein the partition wall of the connector housing is inserted into the slit such that the first predetermined portions of the conductors are accommodated in the respective chambers when the conductors are press-connected with the associated press-connecting terminals.

5. The terminal end structure as set forth in claim 4, wherein the insulating film is formed with a slot arranged between adjacent conductors and extending in a longitudinal direction of the flat circuitry; and
   wherein the end portion of the flat circuitry and the slit is formed by folding a second predetermined portion which is a longitudinal center portion of the slot.

6. The terminal end structure as set forth in claim 5, wherein the folded portion of the flat circuitry is used as a branch connection terminal of the electric connection.

* * * * *